(12) United States Patent
Emori et al.

(10) Patent No.: US 12,408,255 B2
(45) Date of Patent: Sep. 2, 2025

(54) COOLING DEVICE

(71) Applicant: Nissan Motor Co., Ltd., Yokohama (JP)

(72) Inventors: Kenta Emori, Kanagawa (JP); Jumpei Niida, Kanagawa (JP); Emi Takahashi, Kanagawa (JP); Shigeharu Yamagami, Kanagawa (JP)

(73) Assignee: Nissan Motor Co., Ltd., Yokohama (JP)

( * ) Notice: Subject to any disclaimer, the term of this patent is extended or adjusted under 35 U.S.C. 154(b) by 0 days.

(21) Appl. No.: 18/833,455

(22) PCT Filed: Feb. 15, 2022

(86) PCT No.: PCT/IB2022/000071
§ 371 (c)(1),
(2) Date: Jul. 26, 2024

(87) PCT Pub. No.: WO2023/156804
PCT Pub. Date: Aug. 24, 2023

(65) Prior Publication Data
US 2025/0142707 A1    May 1, 2025

(51) Int. Cl.
*H05K 7/20* (2006.01)
*H05H 1/24* (2006.01)

(52) U.S. Cl.
CPC ....... *H05H 1/2439* (2021.05); *H05K 7/20145* (2013.01)

(58) Field of Classification Search
CPC .......... H05H 1/2439; H05K 7/20145
See application file for complete search history.

(56) References Cited

U.S. PATENT DOCUMENTS

2021/0384105 A1* 12/2021 Emori ............... H05K 7/20136

FOREIGN PATENT DOCUMENTS

| JP | H9-252068 A | 9/1997 | |
|---|---|---|---|
| JP | 2009-200252 A | 9/2009 | |
| JP | 2009-290004 A | 12/2009 | |
| JP | 2011-27365 A | 2/2011 | |
| JP | 2013-66376 A | 4/2013 | |
| JP | 2014-183175 A | 9/2014 | |
| JP | 2016-76350 A | 5/2016 | |
| JP | 2020-57720 A | 4/2020 | |
| WO | WO-2020070533 A1 * | 4/2020 | ............. F28D 1/024 |

OTHER PUBLICATIONS

English Machine Translation of Emori et al, WO2020070533 (Year: 2025).*

* cited by examiner

*Primary Examiner* — Donald L Raleigh
(74) *Attorney, Agent, or Firm* — Global IP Counselors, LLP

(57) ABSTRACT

A cooling device is provided with a heat sink having a plurality of fins, and a plasma actuator. Flow paths are formed between adjacent ones of the fins. The plasma actuator is provided away from the fins where the flow paths are formed. The plasma actuator has electrodes that are arranged offset in the flow path direction. The plasma actuator generates an induced air flow flowing in a direction of the flow path in the central region between adjacent fins.

11 Claims, 4 Drawing Sheets

COOLING DEVICE

CROSS-REFERENCE TO RELATED APPLICATIONS

This application is a U.S. national stage application of International Application No. PCT/IB2022/000071, filed on Feb. 15, 2022.

BACKGROUND

Technical Field

The present invention relates to a cooling device, and more particularly to a heat sink provided with a plasma actuator.

Background Information

Converters and other types of power conversion devices include electronic components which produce heat, such as semiconductors, capacitors, and coils, and heat sinks are attached to these electronic components to cool them.

In recent years, there has been growing demand for smaller power conversion devices with higher power output; however, if the electronic components of such power conversion devices are arranged more compactly to achieve a smaller device footprint, the density of the heat-generating elements in these devices increases, and due to the higher power output, the amount of heat produced by the heat-generating elements also increases, resulting in the need to improve the performance of heat sinks that cool such heat-generating elements.

Since, in general, the cooling performance of a heat sink depends on volume (thermal capacity), material (thermal conductivity), and surface area relative to shape (heat transfer area), if the heat sink itself is made larger in order to improve its cooling performance, the overall size of the power conversion device is made larger, thereby increasing the difficulty in downsizing the power conversion device.

Japanese Laid-Open Patent Application No. 2009-290004 (hereinafter Patent Document 1) discloses using a desired shape for the fins of a heat sink relative to the direction of air flow so as to disrupt the air flow over the entire area from the base to the tip of the fins, thereby preventing the air flow from stagnating and thus improving the heat dissipation performance of the heat sink.

SUMMARY

However, the heat sink in Patent Document 1 is subject to a significant pressure loss due to the disruption of the air flow by the fins, creating the need to strengthen the air flow in order to fully utilize the cooling performance of the heat sink, in turn necessitating the provision of a large fan, which makes improving the cooling efficiency of the heat sink and downsizing the power conversion device difficult.

The present invention was devised in light of these issues of the prior art, and has as an object to provide a cooling device with good cooling efficiency and with which a power conversion device or the like can be downsized.

As a result of diligent study to realize the above-mentioned object, the inventors arrived at the present invention, having found that by generating an induced air flow in the center of the flow path of the heat sink, which has a flow path formed by a plurality of fins, more air can be introduced into the above-mentioned flow path, thereby achieving the aforementioned purpose.

Specifically, the cooling device according to the present invention is provided with a heat sink in which a flow path is formed between adjacent fins, and with a plasma actuator. The plasma actuator is formed away from the fins where the flow path is formed, has electrodes that are arranged offset in the flow path direction, and is configured to generate an induced air flow flowing in the central region between the adjacent fins in the direction of the flow path.

By the present invention, a cooling device can be provided that has good cooling efficiency and allows a power conversion device to be downsized, wherein an induced air flow is generated in the central region of the flow path in the heat sink, making it possible to introduce a large amount of air into the flow path.

BRIEF DESCRIPTION OF THE DRAWINGS

Referring now to the attached drawings which form a part of this original disclosure, illustrative embodiments are shown.

DETAILED DESCRIPTION OF EMBODIMENTS

A cooling device according to the present invention will now be described in detail. The cooling device according to the present invention is provided with a heat sink in which flow paths are formed between adjacent fins, and plasma actuators.

Figure 1:
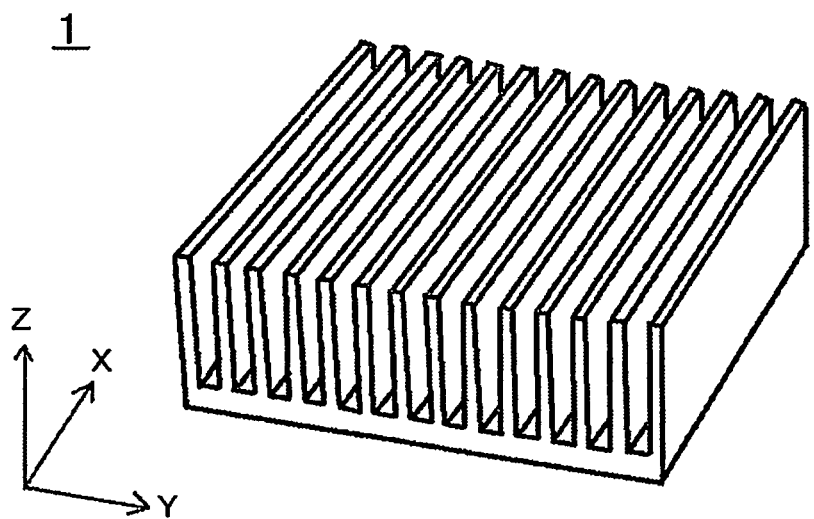
FIG. 1 is a perspective view showing an example of a heat sink that can be used in the present invention.

The heat sink shown in FIG. 1 is a heat sink in which a plurality of parallel flat fins are provided upright on a base plate, with a support plate, not shown, provided at the top of the fins to form flow paths for air flows between the fins together with the base plate.

Since the plasma actuators of the present invention provided in the flow paths are such that a plurality of electrodes are provided offset in the flow path direction, the electric field generated between these electrodes is biased in the flow path direction.

Therefore, the positive ions or electrons in the low-temperature plasma generated by applying an AC voltage between the electrodes, causing an atmospheric-pressure barrier pressure discharge, are accelerated in one direction by the electric field biased in the flow path direction, and collide with surrounding air molecules, generating an induced air flow in the flow path direction (the x-axis direction in FIG. 1).

In the cooling device of the present invention, the induced air flow generated by the plasma actuators flows more toward the area between adjacent fins rather than near the fins, i.e., toward the central region of the flow path (the center in the y-axis direction in FIG. 1), resulting in little friction between the induced air flow and the fins and less of a decrease in flow velocity of the above-mentioned induced air flow, which increases the suction force that draws air outside the flow path into the flow path.

Specifically, on the downstream side of the plasma actuator, the air in the flow path is pushed out by the induced air flow, and on the upstream side, air is drawn into the flow path, thus increasing the amount of air flowing through the flow paths and improving thermal conductance from the fins to the air, thereby enhancing cooling efficiency. Therefore, the cooling device according to the present invention allows for downsizing power conversion devices, etc., as there is no need for a large fan.

Note that in the present invention, the "central region of the flow path" is the area away from the fins, and does not mean the center line of the flow path, so that the place where the induced air flow is strongest may be off the central line of the flow path.

Examples of plasma actuators that produce an induced air flow in the central region between adjacent fins include plasma actuators provided in the central region of the flow path or plasma actuators having electrodes disposed in the fins forming the flow path so as to increase the strength of the lines of force produced between the electrodes in the central region of the flow path.

Figure 2:
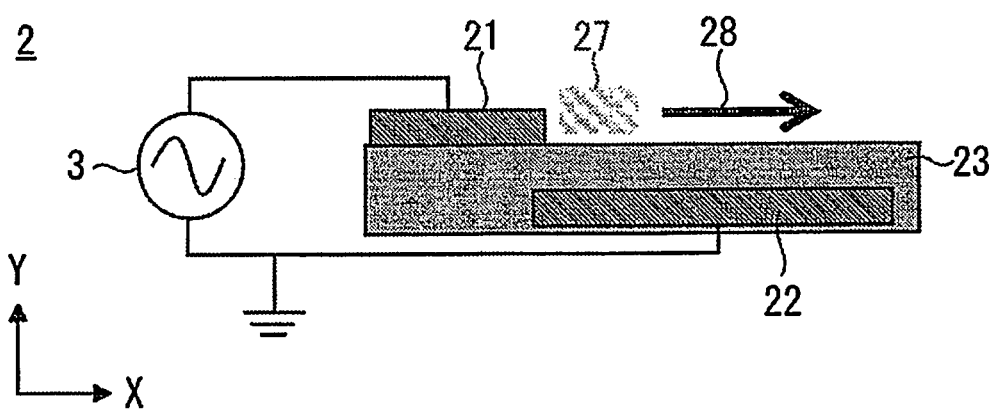
FIG. 2 is a cross-sectional view showing an example of a plasma actuator to be provided in the flow path of the heat sink.

First, the plasma actuators provided in the central region of the flow path are described. As shown in FIG. 2, for example, the plasma actuator provided in the central region of the flow path has a dielectric layer, an upstream electrode, and a downstream electrode, wherein the upstream electrode is exposed on the surface of the dielectric layer, the downstream electrode is incorporated into the dielectric layer, and the downstream electrode is offset relative to the upstream electrode in the in-plane direction of the dielectric layer.

Therefore, when an AC current is applied to the plasma actuator, an atmospheric-pressure barrier discharge is generated on the surface where the upstream electrode is exposed, and since the electric field generated between the electrodes that are offset relative to each other is biased in the flow path direction, the electric field causes the positive ions or electrons to accelerate from the upstream electrode to the downstream electrode in the in-plane direction of the dielectric layer, generating an induced air flow in one direction.

This plasma actuator is provided away from the fins making up the flow path and parallel to the fins so that the induced air flow is in the flow path direction (x-axis direction), thereby making it possible to produce the induced air flow in the central region of the flow path.

A plasma actuator provided to the central region of the flow path can be used that not only generates an induced air flow on one side as shown in FIG. 2, but also generates an induced air flow on both sides.

Figure 3:
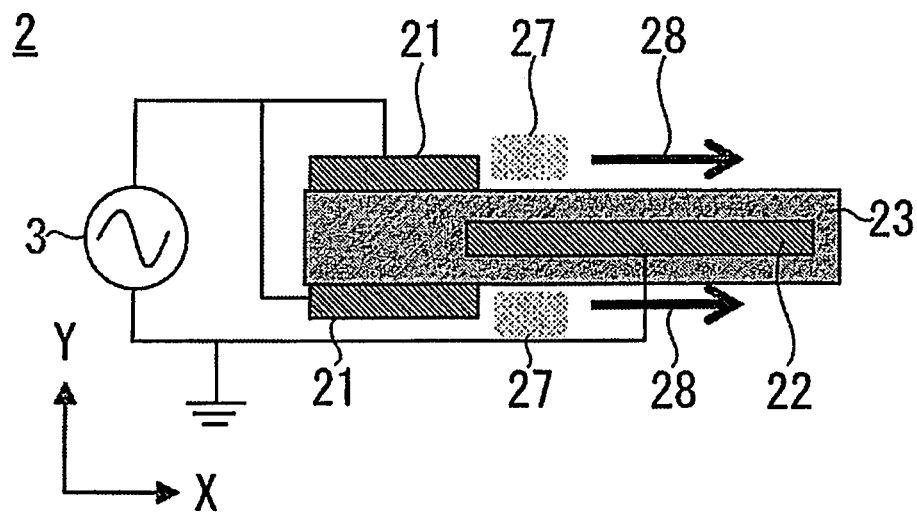
FIG. 3 is a cross-sectional view showing another example of a plasma actuator to be provided in the flow path of the heat sink.

For example, as shown in FIG. 3, by providing the upstream electrodes exposed from the dielectric layer on both front and rear surfaces of the dielectric layer, and providing the downstream electrode incorporated into the dielectric layer in a position offset relative to the upstream electrodes, an induced air flow is generated on both sides of the plasma actuator, enhancing the suction force drawing air into the flow path.

The length of the plasma actuator in the flow path direction is preferably shorter than the length of the flow path. A longer plasma actuator will result in friction between the induced air flow which is generated and the surface of the plasma actuator, slowing the speed of the induced air flow as the air flow moves away from the location the air flow was generated, which tends to reduce the suction force drawing air into the flow path.

The depth of the plasma actuator in the height direction (z-axis direction) of the flow path may be the same as the height of the flow path or shorter than the height of the flow path, but if the depth of the plasma actuator in the height direction of the flow path is the same as the height of the flow path, an induced air flow can be generated along the entire area of the flow path in the height direction, thereby increasing the suction force drawing air into the flow path.

The thickness of the plasma actuator is preferably 20% or less of the flow path width, i.e., the y-axis direction distance between adjacent fins. By making the thickness of the plasma actuator 20% or less of the flow path width, the plasma actuator is less likely to obstruct the air flow in the flow path, preventing an increase in pressure loss due to the plasma actuator and improving cooling efficiency.

Further, the distance between the surface of the plasma actuator and the surface of a fin is preferably 10 mm or less. If the distance between the fin and the surface of the plasma actuator generating the induced air flow is too great, the range within which induced air flows are generated becomes smaller relative to the flow path width, which tends to reduce the suction force drawing air into the flow path. Note that "the surface of the plasma actuator" here means the surface where the induced air flows are generated.

Figure 4:
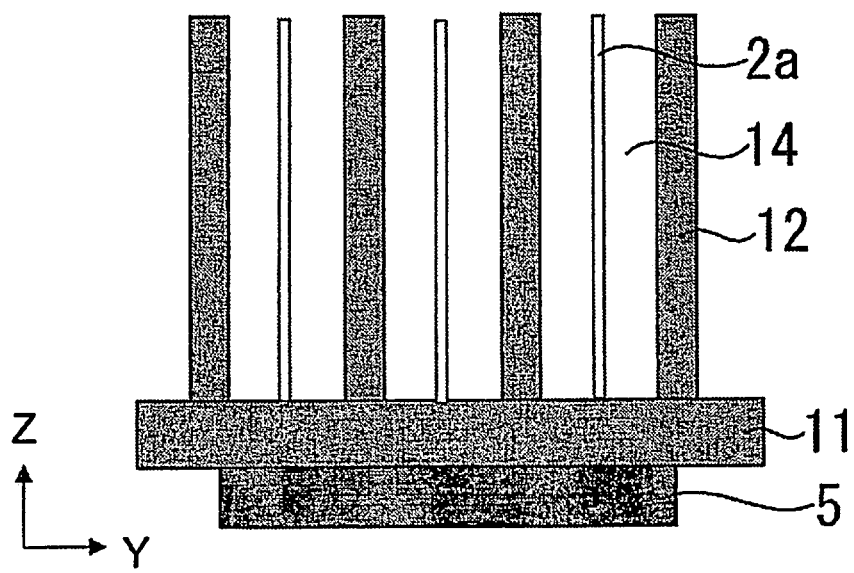
FIG. 4 is a cross-sectional view showing an example of plasma actuators arranged in the flow path of the heat sink.
Figure 5:
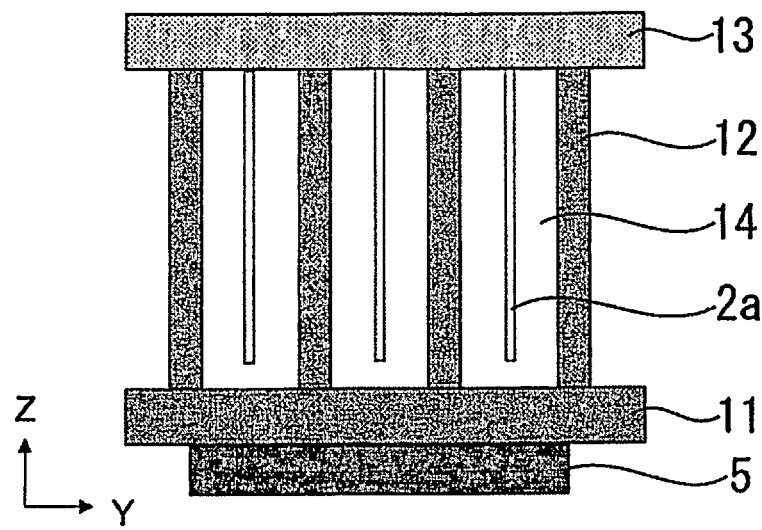
FIG. 5 is a cross-sectional view showing another example of plasma actuators arranged in the flow path of the heat sink.

The plasma actuator may be disposed upright on the base plate of the heat sink, as shown in FIG. 4, or as shown in FIG. 5, the plasma actuator may be provided upright on a support plate separate from the heat sink and then inserted between the fins and arranged in the flow path.

If the plasma actuator is provided upright on the base plate of the heat sink, the plasma actuator itself can be made to function as part of the heat sink, which enhances cooling efficiency.

Further, by inserting the plasma actuator provided upright on the support plate into the flow path, the plasma actuators can be provided to a common comb-type heat sink as well, allowing use of commercially available heat sinks, which can reduce cost.

An example of a plasma actuator with electrodes arranged so that the lines of force are strongest in the central region of the flow path is a plasma actuator in which are formed a first electrode provided on a fin on one side of the flow path, a second electrode provided on the same fin on the same side of the flow path, and a third electrode provided on another fin on the other side of the flow path, where the latter two electrodes are downstream of the first electrode.

Figure 6:
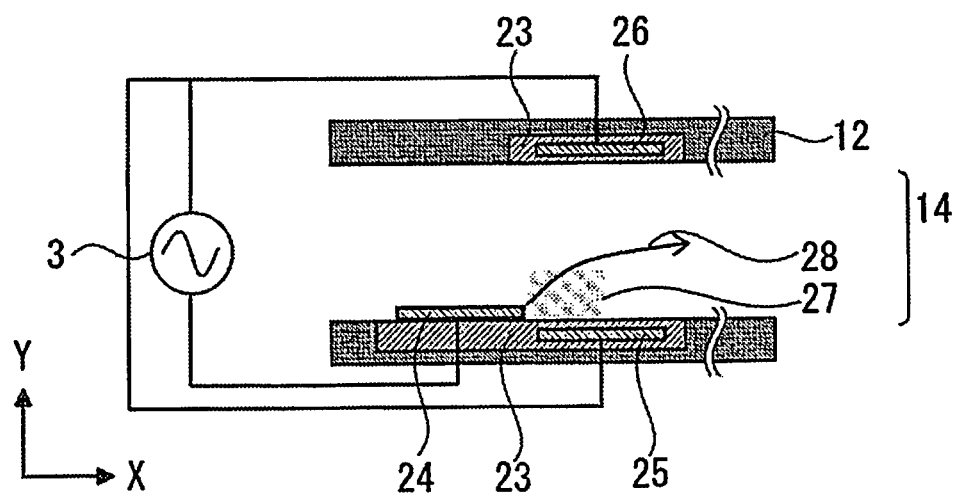
FIG. 6 is a cross-sectional view showing an example of a plasma actuator in which lines of force generated between electrodes are stronger in the central region of the flow path.

As shown in FIG. 6, in this plasma actuator, the first electrode provided on the one fin is exposed on the dielectric layer, whereas the second electrode provided on the same fin as the first electrode and the third electrode provided on the other fin are covered by the dielectric layer.

Further, the electric potential of the second and third electrodes has an opposite polarity of the first electrode so that a low-temperature plasma is generated when an atmospheric-pressure barrier discharge occurs between the first electrode and the second or third electrode.

The electric field formed between the electrodes accelerates the low-temperature plasma to generate an induced air flow; thus, by adjusting the positions of the second and third electrodes relative to the first electrode or the electric potentials of the second and third electrodes so that the above-mentioned electric field is oriented toward the central region of the flow path, an induced air flow can be generated in the central region of the flow path, thereby making it possible to reduce pressure loss due to the plasma actuator.

Figure 7:
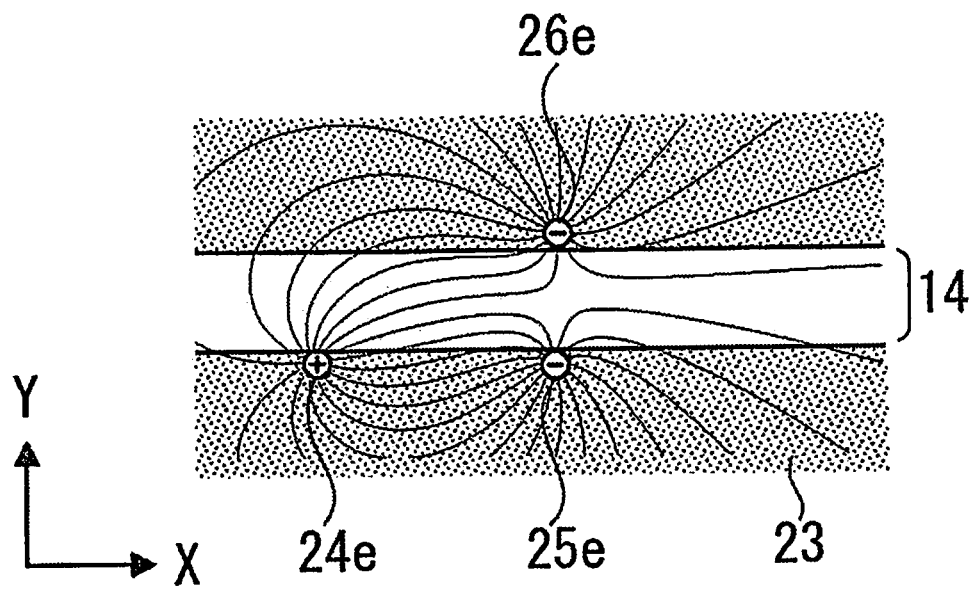
FIG. 7 is a view showing an example of lines of force generated between the plasma actuator electrodes shown in FIG. 6.

FIG. 7 shows an example of the lines of force formed between the first electrode and the second and third electrodes when the second and third electrodes are at the same electric potential.

As shown in FIG. 7, by providing the third electrode, which is at the same polarity as the second electrode, to a different fin than the fin on which the first and second electrodes are provided, the lines of force are drawn towards the third electrode and are therefore oriented toward the central region of the flow path, thereby generating an induced air flow in the central region of the flow path.

Figure 8:
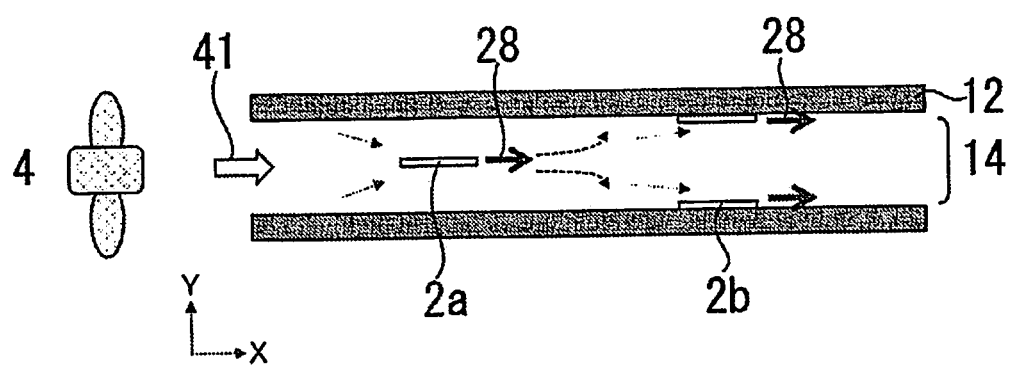
FIG. 8 illustrates induced air flow when a plurality of plasma actuators are disposed in a flow path.

As shown in FIG. 8, in addition to the plasma actuator generating an induced air flow in the central region of the flow path, the cooling device according to the present invention can be provided with a plasma actuator that generates an induced air flow near the fin.

The induced air flow generated by the above-mentioned plasma actuator not only slows down as the induced air flow moves downstream due to friction with the fin, but also forms a boundary layer with lower flow velocity on the surface of the fin, which reduces the thermal conduction from the fin to the air.

By providing a plasma actuator that generates an induced air flow near the fin, the induced air flow can be re-accelerated and the generation of a boundary layer can be suppressed, so that a decrease in cooling efficiency due to the boundary layer can be prevented from occurring.

The configuration of the plasma actuator that generates an induced flow near the fin is the same as the plasma actuator shown in FIG. 2, except that the plasma actuator is provided on the fin.

The plasma actuator that generates an induced air flow near the fin is preferably provided downstream in the direction of the induced air flow from the plasma actuator generating an induced air flow in the central region of the flow path away from the fin.

The induced air flow generated by the plasma actuator that generates an induced air flow in the central region of the flow path spreads out over the entire flow path from the central region of the flow path and towards the fins, moving downstream due to the difference on velocity between the central region of the flow path and the area near the fins.

As shown in FIG. 8, by providing the plasma actuator that generates an induced air flow near the fin downstream to accelerate the air flow near the fin, air flows throughout the flow path, increasing the cooling efficiency.

Note that FIG. 8 only shows one plasma actuator that generates an induced air flow in the central region of the flow path rather than near the fin and one plasma actuator that generates an induced air flow near the fin, but a plurality of the above-mentioned plasma actuators may be provided depending on the length of the flow path. The locations of the plasma actuators provided in adjacent flow paths separated by fins may be the same or different between adjacent flow paths.

The cooling device according to the present invention may include a fan which causes a main air flow to flow through the flow path in the same direction as the induced air flow. By directing the main air flow to the heat sink using the fan, the amount of air introduced into the flow paths increases in combination with the plasma actuators, improving cooling efficiency.

The cooling device according to the present invention has been described using as an example a case in which the fins of the heat sink are flat fins, but as long as the fins form flow paths, the fins are not limited to flat fins, and may be offset fins or pin fins.

The invention claimed is:

1. A cooling device comprising:
a heat sink including a base plate and a plurality of fins provided upright and parallel to one another on the base plate such that at least one flow path is formed between a pair of adjacent fins among the plurality of fins; and
a first plasma actuator arranged between the pair of adjacent fins in the at least one flow path, the first plasma actuator including an electrolyte layer, an upstream electrode, and a downstream electrode,
the first plasma actuator being spaced apart from each of the pair of adjacent fins,
the upstream electrode and the downstream electrode being arranged offset from each other in a flow path direction, and
the first plasma actuator being configured to generate an induced air flow flowing in a central region between the pair of adjacent fins when an AC voltage is applied across the upstream electrode and the downstream electrode, the induced air flow flowing in the flow path direction.

2. The cooling device according to claim 1, wherein the first plasma actuator has a length in the flow path direction that is less than a length of the at least one flow path.

3. The cooling device according to claim 2, wherein the first plasma actuator has a thickness that is 20% or less of a width between the pair of adjacent fins.

4. The cooling device according to claim 2, wherein a distance between a surface of the first plasma actuator and a surface of one of the pair of adjacent fins is 10 mm or less.

5. The cooling device according to claim 1, wherein the first plasma actuator is provided upright on the base plate of the heat sink.

6. The cooling device according to claim 1, wherein the first plasma actuator is provided upright on a support member and is inserted between the fins.

7. A cooling device comprising:
a heat sink in which a flow path is formed between adjacent fins; and
a plasma actuator,
the plasma actuator including a first electrode provided on one of the fins and exposed through a dielectric layer, and a second electrode and a third electrode provided offset farther downstream in a flow path direction than the first electrode and covered by the dielectric layer,
the second electrode is provided on the same fin as the first electrode,
the third electrode is provided on the other fin,
an electric potential of the second electrode and the third electrodes has a polarity that is opposite of the first electrode, and
an induced air flow flowing in the flow path direction is generated between the adjacent fins.

8. The cooling device according to claim 7, wherein
the second and third electrodes have the same electric potential and are arranged in the same position in the flow path direction.

9. The cooling device according to claim 1, further comprising:
second plasma actuator provided on one fin of the pair of adjacent fins and configured to generate an induced air flow near the one fin.

10. The cooling device according to claim 9, further comprising:
a third plasma actuator provided on the other fin of the pair of adjacent fins and configured to generate an induced air flow near the other fin, the second plasma actuator and the third plasma actuator being disposed farther downstream in the induced air flow direction than the first plasma actuator.

11. The cooling device according to claim 1, further comprising:
a fan configured to cause an air flow to flow through the at least one flow path in a same direction as the induced air flow.

* * * * *